United States Patent [19]
Lindholm

[11] Patent Number: 5,390,223
[45] Date of Patent: Feb. 14, 1995

[54] DIVIDER CIRCUIT STRUCTURE

[75] Inventor: Rune Lindholm, Salo, Finland

[73] Assignee: Nokia Mobile Phones Ltd., Salo, Finland

[21] Appl. No.: 907,189

[22] Filed: Jul. 1, 1992

[30] Foreign Application Priority Data

Jul. 4, 1991 [FI] Finland ............................ 913256

[51] Int. Cl.6 .................................... H03K 23/54
[52] U.S. Cl. .................................... 377/49; 377/47; 377/72; 327/115
[58] Field of Search ............... 377/47, 48, 49, 72, 377/110, 111; 328/25, 30

[56] References Cited

U.S. PATENT DOCUMENTS

| | | | |
|---|---|---|---|
| 4,473,885 | 9/1984 | Kamimaru et al. | 377/111 |
| 4,573,176 | 2/1986 | Yeager | 377/48 |
| 5,077,764 | 12/1991 | Yamashita | 377/48 |
| 5,128,673 | 7/1992 | Tamamura et al. | 377/48 |

Primary Examiner—Timothy P. Callahan
Assistant Examiner—Shawn Riley
Attorney, Agent, or Firm—Perman & Green

[57] ABSTRACT

A divider circuit provides an output signal having a frequency which is equal to the frequency of an input signal divided by an odd integer. This is achieved by feeding back the output from a binary counter through an AND gate, delay flip-flop and an OR gate so that one cycle is added the output of the binary counter.

2 Claims, 1 Drawing Sheet

DIVIDER CIRCUIT STRUCTURE

FIELD OF THE INVENTION

The present invention relates to a divider circuit structure, in particular a general synchronous divider circuit for dividing an input clock frequency by an odd number while maintaining a good pulse ratio. The invention relates to digital technology and pulse technology.

BACKGROUND OF THE INVENTION

Means for dividing the frequency of an input signal by an even number are generally known. Using these means, a desired 50% pulse ratio can be achieved i.e. where the output signal is "high" fifty percent of the time and low 50% of the time i.e. giving a unity mark-space ratio.

Dividing frequencies by an odd number is also known and various means of such division exist, however, all the means of the prior art are encumbered with the restriction that the pulse ratio of the output signal is not 50% but remains less than 50%.

If the ratio R between the input clock frequency and the output clock frequency is relatively low i.e. less than 11 to 15, a programmable counter with a pulse ratio of 1/R can be used when the input clock frequency is less than 10 MHz. If the ratio R is high, the input clock frequency must be relatively low, 1 to 2 MHz at most. In both instances the pulse ratio is 1/R unless additional decoding logic is used.

When the ratio R is high, several consecutive counters may be used. If the counters act synchronously, the pulse ratio is always 1/R. The desired frequency can also be generated by adding a completely new frequency into the system, but an extra local oscillator is required in such instance.

Another problem has been that, to date, it has been difficult to have the output signal synchronized. In order to exclude any phase jitter or other distortions, the leading edges should be evenly spaced, as should also the trailing edges. No generally known appropriate means exist for this purpose.

Division by an odd number has, therefore generally been abandoned, and a great number of oscillators of different frequencies have been adopted. This involves extra component costs.

According to the present invention, there is provided a divider comprising, means operable to divide the frequency of an input signal by a pre-determined even integer and to supply the divided signal as an output, and means operable to add one cycle to the divided output signal to provide an output signal for the divider whereby the divider output signal has a frequency which is equal to the frequency of the input signal divided by a pre-determined odd integer. This has the advantage that, whereas previously no appropriate means for arbitrarily forming the pulse ratio of a signal have been generally known, by generalizing the principle of dividing with odd numbers, a systematic and clear-cut means has been provided for the said purpose.

The divider of the present invention provides frequency division by means of a 2N+1 counter where N is the number of flip-flops in the divider, in which the pulse ratio at high N values approaches 50%. Thus because a pulse ratio of almost 50% can be formed with the counter, the output of the circuit can be used for clock frequencies of large circuits both on the leading and the trailing edge. In this case, no problems are caused by deviations between the leading edges and trailing edges.

The outgoing wave form almost approaches symmetry. The counter is completely synchronous. With the present invention, the clock frequency of the system is obtained from the input clock frequency when the ratio R between the input clock frequency and the output clock frequency is an odd integer. It was possible earlier, with the aid of a programmable synchronous counter, to produce the same input signal and output signal ratio, but the pulse ratio has not been close to 50%, especially in high ratios. If the ratio R is an even integer, the output of the counter to be programmed can always be divided with two so that the pulse ratio remains the same.

The invention will now be described by way of example only, with reference to the accompanying figures, of which:

BRIEF DESCRIPTION OF THE DRAWINGS

FIG. 1 represents the operation of the invention in block diagram level. A clock frequency signal enters the synchronous divider of the invention on an input lead denoted by the reference numeral 1. The clock signal on lead 1 is coupled to a register block 2 via an OR gate 4. The register block 2 comprises N consecutively coupled flip-flops. The output of each flip-flop of register block 2 is coupled to a feedback block 3. The feedback block 3 also receives an output signal 5 from the register block 2 and feed it to the OR gate 4 when the output signal of each flip-flop in the register block 2, which are coupled to the feedback block 3, is in a "1" state. The feedback block 3 is controlled by the clock signal of lead 1 connected to the OR gate 4. Therefore the divider (or counter) of the invention can be referred to as a 2N+1 divider where N is the number of flip-flops in register block 2, and is designed to provide an output signal on lead 5 with a frequency which is equal to the frequency of the input clock signal on lead 1 divided by an odd integer.

Figure 1:
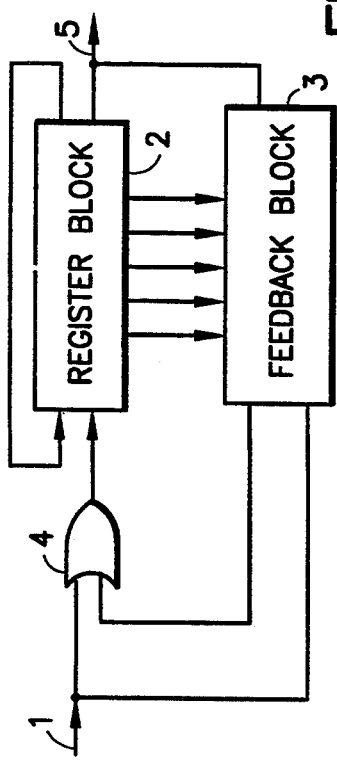
FIG. 1 illustrates a block diagram of an embodiment of a divider circuit according to the principles of the present invention.
Figure 2:
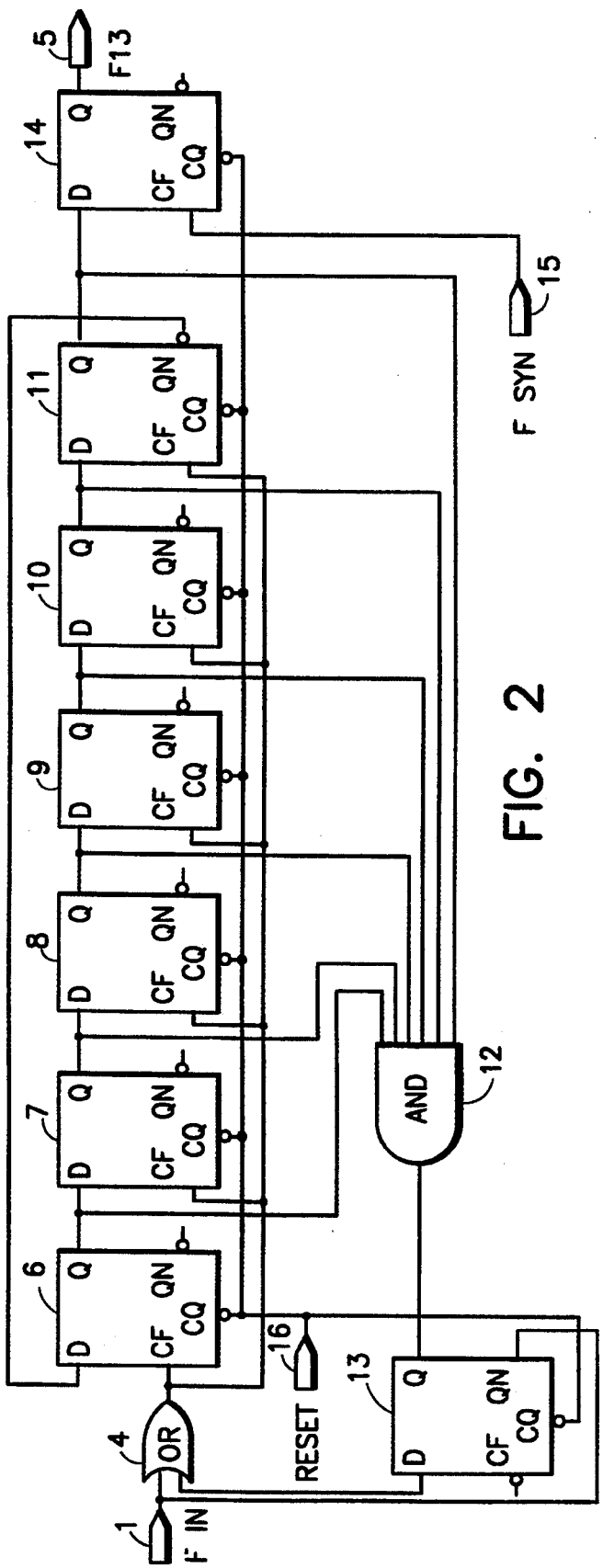
FIG. 2 is a schematic diagram that shows the divider circuit of FIG. 1 in greater detail.

In the embodiment shown in FIG. 2 the register block 2 comprises six D-type flip-flops 6–11. The divider is therefore a 13-divider i.e. 2N+1=13 where N=6. The clock frequency signal on lead 1 passes through the OR gate 4 into the register block 2 containing the six flip-flops 6–11 which are coupled together in succession. The inverse output signal of the flip-flop 11 is fed back on lead 17 to the input of the first flip-flop 6. All the flip-flops 6–11 are connected to the same clock signal via lead 18, which makes the divider synchronous. The register block 2 serves as the 2N counter, i.e. in this example 12, and it changes its state at the intervals of a clock pulse. The feedback block 3 comprises logic indicating when all values of the register block 2 are "1", and which gives the value "1" when this is the case. In the present example, the output of each of the flip-flops 6–11 is coupled to an AND gate 12 of the feedback block 3. The AND gate 12 gives an output signal "1" to the OR gate when the output of each of the flip-flops 6–11 is "1".

The output of the AND gate 12 is delayed, with the aid of a delay flip-flop 13, by one clock cycle, whereafter it is coupled to the input of the OR gate 4 for controlling the clock of the register block 2. In this manner the operation of the counter can be made entirely synchronous. The delay in the feedback block 3 is needed for securing the proper operation of the counter. Were there no delay, the counter would stop when all values of the register block 2 are "1".

The clock signal to register block 2 is controlled with the aid of the OR gate 4. The clock pulse on lead 1 passes through the OR gate 4 when the output of the feedback block 3 is "0". When the output of the feedback block 3 is "1", the clock pulse on lead 1 remains high. When the clock pulse on lead 1 returns to low, it is important that no peaks enter the line going to the register block 2. This can be prevented with the aid of the OR gate 4.

Let us assume that a "1" is signal supplied to the delay flip-flop 13 i.e. the output from the AND element 12 is high. On the leading edge of the subsequent clock pulse on lead 1, the register block 2 is given a clock pulse which carries on for one more period, and the first flip-flop 6 is given the value "0". At the same time, the output of the feedback block 3 i.e. from the flip-flop 13 on the leading edge, rises up and causes output from the OR gate 4 to remain high. When the register block 2 is given the value "0", the output of the AND gate 12 of the feedback block 3 goes low.

At the subsequent leading edge the delay flip-flop 13 is given a clock pulse 1, and the value of the output of the feedback block 3 goes low. Since the input from the feedback block 3 i.e. from the delay flip-flop 13 to the OR gate 4 was high at the leading edge, the register block 2 was given no clock pulse. At the point where the output signal of the feedback block 3 goes low, the clock signal on lead 1 coupled into the OR gate 4 is already high, which keeps the output clock signal output from the OR gate 4 into the register block 2 high. In this manner, one more clock cycle is added to the output of the 2N counter, i.e. the register block 2, so that the output frequency of the signal on lead 5 is equal to the input clock frequency signal output divided by an odd integral.

A flip-flop 14 is provided at the output from the last flip-flop 11 to synchronize the output with the clock signal output 15. In this manner a synchronous output signal at output 5 is produced. The synchronous 2N+1 divider circuit is started with the RESET switch 16.

The pulse ratio is almost 50% for large integers. The counter can be implemented by using separate components or by means of integration on an ASIC. The high time of the output pulse from the divider is $(N+1)/(2N+1)$. The low time of the pulse is $N/(2N+1)$. The pulse ratio of the synchronous 2N+1 counter is then $(N+1)/(2N+1)$. In the instance when N>5 (division with the 11 counter), the pulse ratio is 50% at 10% tolerance.

When a number of counters are placed in sequence in accordance with the invention, the pulse ratio will be $N_n/(2N_n+1)$, where $N_n$ is the count result of the last counter of the chain.

Dividers of this type may be used in data communication technology.

It will be evident, from the foregoing description, to a person skilled in the art, that various modifications are possible within the scope of the present invention, for example, any counter can be used.

I claim:

1. A divider circuit comprising:
   divider means operable to divide the frequency of an input signal by a pre-determined even integer and to supply the divided signal as an output; and
   adding means operable to add one cycle to the divided output signal to provide an output signal for said divider whereby the divider output signal has a frequency which is equal to the frequency of said input signal divided by a pre-determined odd integer,
   wherein said adding means comprises delay means operable to delay coupling of said input signal to said dividing means by one cycle such that said divider output signal has one cycle added thereto,
   wherein said divider means comprises at least one flip-flop coupled in series and said delay means is operable in response to a signal from a first logic means operable to supply the first logic means signal when the outputs from said at least one flip-flop are all in the same state, and
   wherein said delay means comprises a flip-flop coupled to the logic means for receiving said first logic means signal therefrom and to supply a signal to a second logic means in response thereto, said second logic means being operable to delay coupling of said input signal to said divider means in response said second logic means signal.

2. A divider circuit according to claim 1 wherein the second logic means is an OR gate.

* * * * *